United States Patent [19]

Kaimoto et al.

[11] Patent Number: 5,585,222
[45] Date of Patent: Dec. 17, 1996

[54] RESIST COMPOSITION AND PROCESS FOR FORMING RESIST PATTERN

[75] Inventors: Yuko Kaimoto; Koji Nozaki, both of Kawasaki, Japan

[73] Assignee: Fujitsu Limited, Kawasaki, Japan

[21] Appl. No.: 945,909

[22] Filed: Sep. 17, 1992

[30] Foreign Application Priority Data

Sep. 19, 1991 [JP] Japan .................................. 3-239871

[51] Int. Cl.$^6$ .............................. G03F 7/30; G03F 7/38; G03C 5/00
[52] U.S. Cl. ................. 430/296; 430/270.1; 430/325; 430/326; 430/330; 430/910; 430/942; 430/945; 430/966; 430/967
[58] Field of Search ................... 430/296, 326, 430/325, 330, 270, 910, 945, 966, 967, 942, 323, 313; 216/2, 49; 156/646.1, 659.11

[56] References Cited

U.S. PATENT DOCUMENTS

| | | | |
|---|---|---|---|
| 4,751,168 | 6/1988 | Tsuchiya et al. | 430/272 |
| 4,912,018 | 3/1990 | Osuch et al. | 430/325 |
| 5,118,585 | 6/1992 | Schwalm et al. | 430/325 |
| 5,212,043 | 5/1993 | Yamamoto et al. | 430/192 |

OTHER PUBLICATIONS

Ito et al. ACS Symp. Ser. (1989), 412, "Polymers in Microlithography," pp. 57 to 73.

Primary Examiner—Janis L. Dote
Attorney, Agent, or Firm—Armstrong, Westerman, Hattori, McLeland, & Naughton

[57] ABSTRACT

A resist composition and a process for forming a resist pattern using a resist composition are disclosed. The present composition includes 100 parts by weight of a copolymer of a 2-norbornene-2-substituent unit and an acrylic acid ester unit of the formula I;

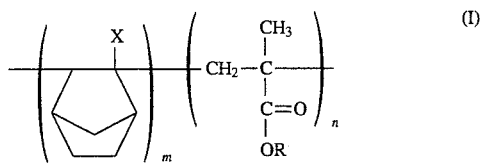

wherein, X is a cyano or chloro group, R is tert-butyl, dimethylbenzyl, or tetrahydropyranyl, m is an integer of 9 to 2390, and n is an integer of 21 to 5180, and 1 to 20 parts by weight of a photo acid generator. A finely-resolved resist pattern with high sensitivity and good dry etch resistance is obtained by the present composition and present process for forming the resist pattern.

9 Claims, No Drawings

RESIST COMPOSITION AND PROCESS FOR FORMING RESIST PATTERN

BACKGROUND OF THE INVENTION

1. Field of the Invention

The present invention relates to a resist composition and a process for forming a resist pattern.

More particularly, the present invention relates to a resist composition containing a certain copolymer and a photo acid generator and also relates to the process for forming the resist pattern having a high sensitivity and a good dry etch resistance.

2. Description of the Related Art

Due to the necessity of treating a large amount of information at a high speed on an integrated semiconductor device, which plays a main role in an information treating device, large-scale integrated circuits (LSI) and very large-scale integrated circuits (VLSI) have been developed and are now in practice.

This integration is carried out by the miniaturization of unit elements such as wiring patterns and electrodes. At present, the use of submicron minimum line spacing in the wiring pattern is common.

When forming a fine resist pattern, ultraviolet lights were employed as an exposure light source at the beginning of the photolithography. Due to limitations in the use of wavelength, an exposure process using deep ultraviolet lights are carried out.

Here, the exposure light source that radiates deep ultraviolet lights as mentioned can be a high pressure mercury lamp or an excimer laser.

However, there is the problem that the power of the high pressure mercury lamp is low, in the wavelength region of the deep ultraviolet light.

Therefore, the use of a large power excimer laser (for instance, when KrF is used, the wavelength is 248 nm) has been considered as the exposure light source.

However, even if the excimer laser is employed, the prior resist composition cannot be used, because said resist absorbs too much deep ultraviolet light, so that the said resist results in sloped wall profiles and poor resolution.

Therefore, practical use of such a resist composition having a high resolution and capable of being applied to the above wavelength light is desired.

In the conventional resist composition, many kinds of resists containing an aromatic ring (such as a benzene ring) so as to obtain good dry etch resistance, for instance, a phenol novolak resin, have been developed as a base polymer.

However, the resist containing an aromatic ring absorbs far too much deep ultraviolet light, so that a fine pattern corresponding to miniaturization in the patterning process using deep ultraviolet lights as an exposure light source cannot be obtained.

On the other hand, as a KrF excimer resist, the resist including an acrylate polymer such as poly t-butymethocrylate as a base polymer has been studied but, it was found that said polymer did not display good dry etch resistance because of the lack of the aromatic ring.

Therefore, practical use of such a resist composition having good dry etch resistance and good transparency, in which the polymer lacks an aromatic ring is strongly desired.

The necessary requirements for the resist that can be adopted for use in the region of an deep ultraviolet light are as follows:

1) Minimal absorption in the region of deep ultraviolet lights and having a high resolution;

2) High sensitivity; and

3) Superiority in dry etch resistance.

However, a resist fully satisfying the above requirements has not yet been developed.

Therefore, there is a need to develop a resist that satisfies the above requirements and to apply said resist.

SUMMARY OF THE INVENTION

A primary object of the present invention is to provide a new chemically amplified resist composition that is effective in forming a fine pattern in the process of the production of the semiconductor.

It is another object of the present invention to provide a process of forming a resist pattern using the above resist composition.

Namely, the first mentioned object can be attained by the present chemically amplified resist composition that comprises:

100 parts by weight of a copolymer consisting of a 2-norbornene-2-substituent unit and an acrylic acid ester unit of the formula I;

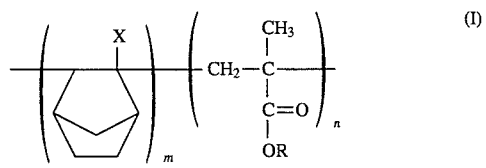

wherein, X is a cyano or chloro group, R is tert-butyl, dimethylbenzyl, or tetrahydropyranyl, m is an integer of 9 to 2390, and n is an integer of 21 to 5180, and 1 to 20 parts by weight of a photo acid generator.

The second mentioned object can be attained by the present process for forming a resist pattern that comprises the steps of:

coating a substrate to be fabricated with a resist composition comprising 100 parts by weight of a copolymer consisting of a 2-norbornene-2-substituent unit and an acrylic acid ester unit of the formula I;

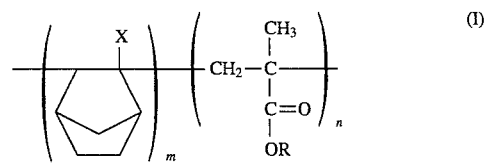

wherein, X is a cyano or chloro group, R is tert-butyl, dimethylbenzyl, or tetrahydropyranyl, m is an integer of 9 to 2380, and n is an integer of 21 to 5180, and 1 to 20 parts by weight of a photo acid generator, drying the resist composition to form a resist coating, exposing the resist coating selectively to a predetermined pattern of radiation to form a latent image in the resist layer corresponding to the radiation pattern, and baking the resist coating, followed by developing the pattern-wise exposed resist coating with a developer to form a resist pattern.

DESCRIPTION OF THE PREFERRED EMBODIMENTS

The above-mentioned problems can be solved by the present resist composition and a process for forming a resist pattern.

The present inventors carried out experiments with the hope of finding a new polymer having superior dry etch resistance properties and a greater sensitivity than that of the conventional resist.

As a result of the experiments, the present inventors discovered the new copolymer consisting of a 2-norbornene-2-substituent unit and acrylic acid ester unit, as a base polymer for the chemically amplified resist.

Namely, the present inventors selected the monomer unit, 2-norbornene-2-substituent, as a material providing good dry etch resistance. The above unit is an aliphatic hydrocarbon and works as resistant groups in dry etching in the same way as aromatic rings, and also does not absorb light at deep ultraviolet wavelengths because of the lack of aromatic rings.

Therefore, the present inventors selected a copolymer consisting of a 2-norbornene-2-substituent unit having no capacity for absorbing deep ultraviolet light and an acrylic acid ester unit having no capacity for absorbing deep ultraviolet light as a base polymer to satisfy the requirements of the above 1) and 3). Furthermore, the present inventors added the photo acid generator (in short PAG) to the above-mentioned copolymer to form a chemically amplified resist that provides high sensitivity and fulfills the above-mentioned three requirements 1) and 3).

The chemically amplified resist was proposed by IBM (U.S. Pat. No. 4,491,628). This type of resist attempts to realize high-sensitivity and high resolution by employing the PAG, which generates Strong Broensted acids by means of exposure.

Namely, the PAG is added to the polymer to obtain a chemically amplified resist. The characteristics of this resist are such that the Broensted acid generated from the PAG by light-exposure acts on the polymer as a catalyst by means of post-baking (heating) carried out after said exposure, and causes the successive elimination reaction of the protecting group as well as a change in polarization.

Therefore, this type of the resist can provide a positive-working pattern in fine resolution by developing same in an alkaline solution.

Next, the reaction proceeds as shown in the following formula II, when the present resist is exposed to ultraviolet lights:

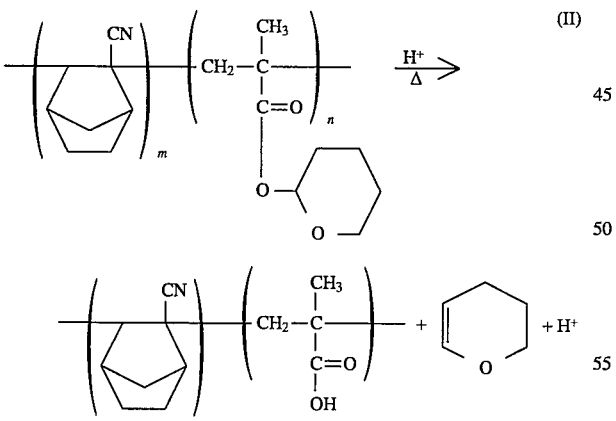

(II)

As shown above, the esters moiety in the acrylate unit in the exposure areas changes to carboxylic acids that can be dissolved in an alkaline solution.

As mentioned above, the present invention can utilize the change of polarity of the polymer to effect patterning, so that a non-swelling pattern can be obtained. Furthermore, the present base polymer consists of the copolymer of an acrylate monomer unit and an alicyclic monomer unit, so that the present resist is highly transparent and can provide a finely-figured pattern. And also, the above-mentioned reaction (2) is a type of amplification in which proton regenerates, so that the resist is highly sensitive.

In the present composition, the following compounds can be employed as the PAG:

a diaryl indonium salt such as

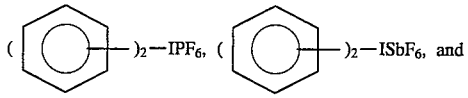

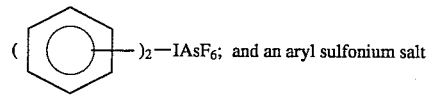

and an aryl sulfonium salt for example, triaryl sulfonium salts such as

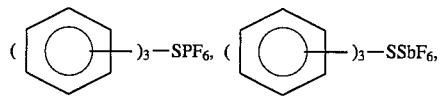

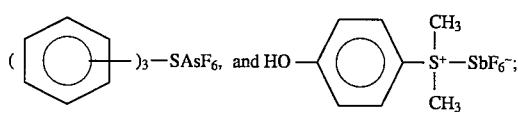

sulfonic acid derivatives for example, sulfonic acid esters such as

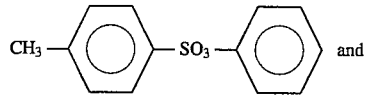

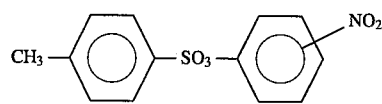

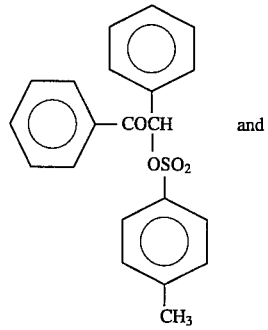

and

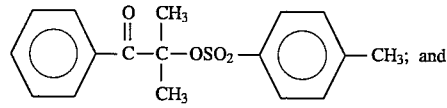

halogen-containing compounds such as

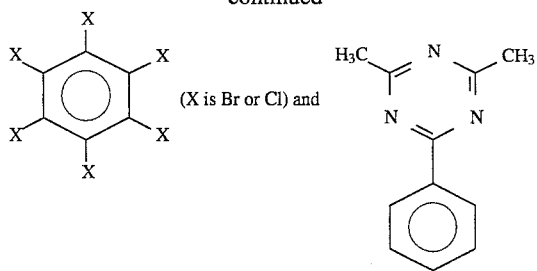

The PAG can be used in a ratio of 1 to 20 parts by weight based on 100 parts by weight of the polymer in the present composition. When less than 1 part by weight of the PAG is used in the composition, the expected reaction does not proceed, while, when more than 20 parts by weight of the PAG is used, the transparency and resolution of the resist is poor.

The process of the present invention is valuable for the formation of either a positive-working resist pattern or a negative-working resist pattern. When a negative-working pattern is expected to be obtained, a nonpolar organic solvent is usually used as a developer, and when a positive-working pattern is expected to be obtained, a polar organic solvent or an alkaline aqueous solution such as tetramethyl ammonium hydroxide (TMAH) and 2-hydroxyethyl trimethyl ammonium hydroxide (choline) is usually used as a developer. Moreover, the resist material to be used in the present invention can have a sensitivity to light from various light sources, and in the instant specification, the word "light" or "radiation" is used in a broad sense, and a variety of light sources ranging from high-energy radiation light such as electron beams and ion beams to X-rays and deep ultraviolet light can be used.

In the present invention, the preferred light source is an excimer laser.

Also, in the present invention, a drying process is effected at room temperature or under baking conditions to vaporize the solvent in the resist composition coating.

Also, in the present invention, a baking process is preferably carried out at a temperature of about 60° C. to about 120° C. to accelerate the reaction of the present copolymer with a photo acid generator expressed by the above-mentioned formula II.

If the temperature in the post exposure baking process is less than about 60° C., the sensitivity of the obtained resist pattern is low. On the other hand, if the temperature is over about 120° C., the above reaction of the formula II proceeds too fast.

The invention will be more clearly understood with reference to the following examples. It is to be expressly understood, however, that the examples are for the purpose of illustration only and are not intended as a definition of the limits of the invention.

EXAMPLES

Synthetic Example 1: (Synthesis of copolymer of 2-norbornene-2-carbonitrile and methacrylic acid tetrahydropyranyl ester)

5.0 g (41.6 m mol) of 2-norbornene-2-carbonitrile, 4.72 g (27.7 m mole) of methacrylic acid tetrahydropyranyl ester and 13.9 ml of tetrahydrofuran (fully dried) (in short THF) were charged into 100 ml of the three-necked flask equipped with a magnetic stirring bar coated with a fluorine polymer (Teflon, which is a registered mark), followed by stirring at −17° C. for ten minutes under a nitrogen atmosphere.

To this solution, 311 mg (2.8 m mol, 4 mol%) of potassium tert-butoxide was dissolved and 4 ml of dry THF was slowly added dropwise by means of a syringe.

Next, the solution which was prepared by dissolving 740 mg (2.8 m mol) of 18-crown-6 and 2 ml of THF was slowly added dropwise to the above solution by means of a syringe while maintaining the temperature of the reaction system, and then stirring for 1.5 hours.

Next, the reaction system was allowed to stand at room temperature, followed by stirring for 4 hours and the reaction was stopped by adding 10 ml of THF (commercial grade).

1.5 l of methanol was added to the reaction solution to form precipitates, then the thus obtained precipitates were filtered off through a glass filter (3G), then dried under 0.1 mm Hg at 40° C. for 6 hours to form white powder.

The obtained powder was dissolved in 30 ml of THF, followed by represciptating the solution using 1.5 L of methanol.

Next, the obtained white precipitates were filtered off through a glass filter (3G), then dried under 0.1 mm Hg at 40° C. for 16 hours to form white powder.

The obtained copolymer yielded 3.35 g (34.5%), the average molecular weight of the copolymer is 32000, the degree of dispersion is 1.73 and the rate of copolymerization of norbornene to methacrylate is 36 to 64.

Incidentally, the starting monomer of 2-norbornene-2-carbonitrile can be obtained by the following steps:

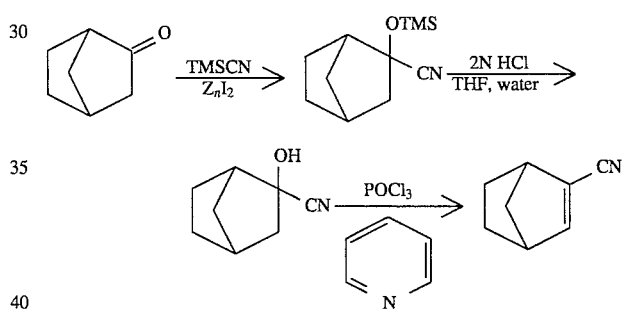

Synthetic Example 2: (Synthesis of copolymer of 2-norbornene-2-carbonitrile and methacrylic acid t-butyl ester)

7.5 g (62.4 m mol) of 2-norbornene-2-carbonitrile, 5.91 g (41.6 m mole) of methacrylic acid t-butyl ester and 20.8 ml of tetrahydrofuran (fully dried) (in short THF) were charged into 100 ml of the three-necked flask equipped with a magnetic stirrer coated with a fluorine polymer (Teflon, which is a registered mark), followed by stirring at −17° C. for ten minutes under a nitrogen atmosphere. To this solution, 467 mg (4.2 m mol, 4 mol%) of potassium tert-butoxide was dissolved and 5 ml of dry THF were slowly added dropwise by means of a syringe while maintaining the temperature of the reaction system. Next, the system was stirred at −17° C. for 0.5 hours, and the reaction was stopped by adding 50 ml of THF (commercial grade). 2.0 l of methanol was added to the reaction solution to form precipitates, then the obtained precipitates were filtered off through a glass filter (3G), and dried under 0.1 mm Hg at 60° C. for 6 hours to form yellow powder. The obtained powder was dissolved in 100 ml of THF, followed by reprecipitation of the solution by using 2.0 l of methanol.

Next, the obtained white precipitates were filtered off through a glass filter (3G), then dried under 0.1 mm Hg at 60° C. for 16 hours to form white powder.

The obtained copolymer yielded 7.82 g (58.3%), the average molecular weight of the copolymer is 17000, the degree of dispersion is 1.57 and the rate of copolymerization of norbornene to methacrylate is 59 to 41.

Example 1

10% by weight of benzoin tosylate used as PAG was added to the copolymer of 2-norbornene-2-carbonitrile and methacrylic acid tetrahydropyranyl ester (copolymerization ratio, 36:64) prepared by the procedure described in Synthetic Example 1, and was dissolved in a cyclohexane solution to prepare 20% by weight of a solution as a resist composition.

The obtained resist composition was spin-coated on a Si-wafer, then heated for 20 minutes at a temperature of 100° C. to dry the resist and obtain a resist coating having a thickness of 1 μm.

This coating was exposed to a predetermined pattern of radiation to form a latent image by using a KrF excimer laser, then baked at 100° C. for 60 seconds and developed in an aqueous solution of 2.38% tetramethyl ammonium hydroxide (TMAH) for one minute to obtain a positive resist pattern.

The transmittance of the resist coating at 248 nm of the wavelength was 66%/μm, and the sensitivity therefor was 1.0 mJ/cm$^2$. And also, 0.4 μm lines-and-spaces were resolved.

Next, the resist coating was set in the dry-etching apparatus, and etched using of $CF_4/O_2$ (Flow rate: 0.95/0.05) as an etching gas, 0.3 torr, and 300 W. The etching rate of the resist in Example 1 was found to be 970 Å/min, which is superior to that of the NPR-820 resist (supplied by Nagase Sangyo Co., Ltd.) which has an etching rate of 980 Å/min. Therefore, it is found that the present resist composition has better dry etch resistance than those of the conventional Novolak resist.

Example 2

10% by weight of triphenylsulphonium hexafluoroantimonate used as PAG was added to the copolymer of 2-norbornene-2-carbonitrile and methacrylic acid t-butyl ester (copolymerization ratio, 59:41) prepared by the procedure described in Synthetic Example 2, followed by dissolving same in a cyclohexane solution to prepare 16% by weight of a solution as a resist composition.

The obtained resist composition was spin-coated on a Si-wafer, then heated at 100° C. for 20 minutes to dry the resist and obtain a resist coating having a thickness of 1 μm.

This coating was exposed to a predetermined pattern of radiation so as to form a latent image by using a KrF excimer laser, then post-exposure baked at 100° C. for 60 seconds and developed in an aqueous solution of 2.38% tetramethyl ammonium hydroxide (TMAH) for one minute to obtain a positive resist pattern.

The transmission of the resist coating at 248 nm of the wavelength was 62%/μm, and the sensitivity therefor was 10 mJ/cm$^2$. And also, 0.4 μm lines-and-spaces were resolved.

Next, the resist coating was set in the dry-etching apparatus, and etched using $CF_4/O_2$ (Flow rate: 0.95/0.05) as an etching gas, 0.3 torr and 300 W. The etching rate for the resist in Example 1 was found to be 892 Å/min, which is superior to that of the NPR-820 resist (supplied by Nagase Sangyo Co., Ltd.) which has an etching rate of 980 Å/min. Therefore, it is found that the present resist composition has better dry etch resistance than those of the conventional Novolak resist.

Example 3

10% by weight of p-toluene suphonic acid phenyl ester used as PAG was added to the copolymer of 2-norbornene-2-carbonitrile and methacrylic acid t-butyl ester (copolymerization ratio, 59:41) prepared by the procedure described in Synthetic Example 2, followed by dissolving same in a cyclohexane solution to prepare 16% by weight of a solution as a resist composition.

The obtained resist composition was spin-coated on a Si-wafer, then heated for 20 minutes at a temperature of 100° C. to dry the resist and obtain a resist coating having a thickness of 1 μm.

This coating was exposed to a predetermined pattern of radiation to form a latent image by using a KrF excimer laser, then heated for 60 seconds at a temperature of 100° C. and developed in an aqueous solution of 2.38% tetramethyl ammonium hydroxide (TMAH) for one minute to obtain a positive resist pattern.

The transmission of the resist coating at 248 nm of the wavelength was 67%/μm, and the sensitivity therefor was 10 mJ/cm$^2$ 0.4 μm in a lines-and-spaces were resolved.

Next, the resist coating was set in the dry-etching apparatus, and etched using of $CF_4/O_2$ (Flow rate: 0.95/0.05) as an etching gas., 0.3 torr, and 300 W. The etching rate for the resist in Example 1 was found to be 892 Å/min, which is superior to that of the NPR-820 resist (supplied by Nagase Sangyo Co., Ltd.) which has an etching rate of 980 Å/min. Therefore, it is found that the present resist composition has better dry etch resistance than those of the conventional Novolak resist.

The above descriptions are the result of an excimer laser being employed as an exposure light source, however, other exposure lights sources such as X-rays and electron beams could be employed in the present process and a finely-resolved pattern could be obtained.

As the present composition is constructed as described in the specification, the present resist composition can provide good dry etch resistance, highly sensitive, and highly resolved resist coating. Hence, the present composition ensures the formation of a finely resolved pattern.

We claim:

1. A process for forming a resist pattern consisting essentially of the steps of:

coating a substrate to be fabricated with a resist composition comprising 100 parts by weight of a copolymer consisting of a 2-norbornene-2-substituent unit and an acrylic acid ester unit of the formula I;

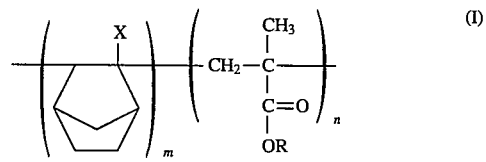

wherein, X is a cyano or chloro group, R is tert-butyl, dimethylbenzyl, or tetrahydropyranyl, m is an integer of 9 to 2380, and n is an integer of 21 to 5180, and 1 to 20 parts by weight of a photo acid generator, drying the resist composition to form a resist coating, exposing the resist coating selectively to a predetermined pattern of radiation to form a latent image in the resist layer corresponding to the radiation pattern, and then baking the resist coating, followed by developing the pattern-wise exposed resist coating with a developer to form a resist pattern.

2. a process according to claim 1, wherein said radiation is an electron beam, excimer laser or X-ray.

3. a process according to claim 1, wherein said radiation comprises deep ultraviolet light.

4. A process according to claim 1, wherein the photo acid generator is a compound selected from the group consisting of triarylsulfonium salt and sulfonic acid ester.

5. The process of claim 4 wherein said sulfonic acid ester is benzoin tosylate.

6. A process for forming a resist pattern according to claim 1 wherein the developer is a nonpolar organic solvent.

7. A process for forming a resist pattern according to claim 1 wherein the developer is an alkaline aqueous solution or a polar organic solvent.

8. A process according to claim 1; the baking is carried out from about 60°C. to about 120°C.

9. A process for forming a resist pattern using a resist composition comprising 100 parts by weight of a copolymer consisting of a 2-norbornene-2-substituent unit and an acrylic acid ester unit of the formula I;

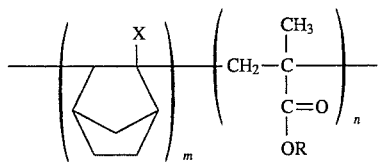

wherein, X is a cyano or chloro group, R is tert-butyl, dimethylbenzyl, or tetrahydropyranyl, m is an integer of 9 to 2380, and n is an integer of 21 to 5180, and 1 to 20 parts by weight of a photo acid generator, said process comprosing the steps of:

coating a substrate with said resist composition, drying the resist composition to form a resist coating, exposing the resist coating selectively to a predetermined pattern of radiation to form a latent image in the resist layer corresponding to the radiation pattern, and then baking the resist coating, followed by developing the pattern-wise exposes resist coating with a developer to form a resist pattern.

\* \* \* \* \*